United States Patent
Zhao et al.

(10) Patent No.: US 11,107,794 B2
(45) Date of Patent: Aug. 31, 2021

(54) MULTI-WAFER STACK STRUCTURE AND FORMING METHOD THEREOF

(71) Applicant: WUHAN XINXIN SEMICONDUCTOR MANUFACTURING CO., LTD., Hubei (CN)

(72) Inventors: Changlin Zhao, Hubei (CN); Tianjian Liu, Hubei (CN)

(73) Assignee: WUHAN XINXIN SEMICONDUCTOR MANUFACTURING CO., LTD., Hubei (CN)

( * ) Notice: Subject to any disclaimer, the term of this patent is extended or adjusted under 35 U.S.C. 154(b) by 0 days.

(21) Appl. No.: 16/393,179

(22) Filed: Apr. 24, 2019

(65) Prior Publication Data
US 2020/0075552 A1  Mar. 5, 2020

(30) Foreign Application Priority Data
Aug. 28, 2018  (CN) .......................... 201810988464.6

(51) Int. Cl.
| | |
|---|---|
| *H01L 21/768* | (2006.01) |
| *H01L 23/522* | (2006.01) |
| *H01L 25/065* | (2006.01) |
| *H01L 23/31* | (2006.01) |

(52) U.S. Cl.
CPC .... *H01L 25/0657* (2013.01); *H01L 21/76805* (2013.01); *H01L 21/76832* (2013.01); *H01L 23/3171* (2013.01); *H01L 23/3192* (2013.01); *H01L 23/5226* (2013.01)

(58) Field of Classification Search
None
See application file for complete search history.

(56) References Cited

U.S. PATENT DOCUMENTS

| | | | |
|---|---|---|---|
| 2007/0134819 A1* | 6/2007 | Uchiyama | ............... H01L 25/50 438/3 |
| 2012/0193785 A1* | 8/2012 | Lin | ......................... H01L 24/97 257/737 |

FOREIGN PATENT DOCUMENTS

| | | | | |
|---|---|---|---|---|
| CN | 105280611 A | | 1/2016 | |
| CN | 107994043 | * | 5/2018 | ........... H01L 27/146 |
| CN | 107994043 A | | 5/2018 | |

* cited by examiner

*Primary Examiner* — Xiaoming Liu
(74) *Attorney, Agent, or Firm* — Muncy, Geissler, Olds & Lowe, P.C.

(57) ABSTRACT

A multi-wafer stack structure and fabricating method thereof are disclosed. In the multi-wafer stack structure, the first interconnection layer is electrically connected to the second metal layer and the first metal layer via the first opening, the second interconnection layer is electrically connected to the first interconnection layer via the second openings, the third interconnection layer is electrically connected to the third metal layer via the third openings, and the second interconnection layer is in contact with the third interconnection layer, so that there is no need to reserve the wire pressure welding space between the wafers and a silicon substrate is eliminated, the overall device thickness of the multi-wafer stack package is reduced. Moreover, the design processing of the silicon substrate and a plurality of common pads on the silicon substrate is eliminated, thereby reducing the parasitic capacitance and power loss, and increasing the transmission speed.

7 Claims, 8 Drawing Sheets

Fig. 1

| Step | Description |
|---|---|
| S1 | Provide a first wafer and a second wafer, where the first wafer includes a first substrate, a first dielectric layer and a first metal layer, the second wafer includes a second substrate, a second dielectric layer and a second metal layer, and the first dielectric layer and the second dielectric layer are bonded to each other |
| S2 | Form a first opening, where the first opening includes a first lower opening and a first upper opening; the first lower opening penetrates through the first substrate, the first dielectric layer and the second dielectric layer in part of thickness, and the first lower opening is located above the second metal layer and exposes a portion of the second metal layer; the first upper opening penetrates through the first substrate and the first dielectric layer in part of thickness, and the first upper opening exposes a portion of the first metal layer; the first lower opening communicates with the first upper opening |
| S3 | Form a first interconnection layer, where the first interconnection layer is electrically connected to the second metal layer and the first metal layer through the first opening |
| S4 | Form an insulating layer, where the insulating layer is located on a surface of the first substrate and the first interconnection layer, and forming a second opening in the insulating layer, where the second opening exposes a portion of the first interconnection layer |
| S5 | Provide a third wafer, where the third wafer includes a third substrate, a third dielectric layer and a third metal layer |
| S6 | Form a third opening, where the third opening penetrates through a portion of the third dielectric layer and exposes a portion of the third metal layer, and the third opening is disposed corresponding to the second opening |
| S7 | Form a second interconnection layer and a third interconnection layer, where the second interconnection layer is electrically connected to the first interconnection layer through the second opening, and the third interconnection layer is electrically connected to the third metal layer through the third opening |
| S8 | Bond the first wafer and the third wafer to bring the second interconnection layer into contact with the third interconnection layer to implement interconnection of the first wafer, the second wafer and the third wafer |

MULTI-WAFER STACK STRUCTURE AND FORMING METHOD THEREOF

CROSS-REFERENCE TO RELATED APPLICATION

This application claims the priority of Chinese patent application number 201810988464.6, filed on Aug. 28, 2018, the entire contents of which are incorporated herein by reference.

TECHNICAL FIELD

The present invention pertains to the technical field of integrated circuit manufacturing, and in particular, relates to a multi-wafer stack structure and a forming method thereof.

BACKGROUND

In the trend of highly integrated semiconductor development, wire bonding is often used after multi-wafer stacking to achieve interconnections between multiple wafers. Specifically, multiple wafers are stacked vertically on a dedicated silicon substrate, each wafer has a plurality of pads for interconnection, the silicon substrate has a plurality of common pads, one end of the wire is pressure-bonded to the pad of the wafer, and the other end of the wire is collectively pressure-bonded to the common pad of the silicon substrate, thereby achieving interconnection between the multiple wafers.

However, the inventors have found that there are some problems with the traditional multi-wafer wire interconnection method. First, there are restrictions on the development of multi-wafer stacking to high-density thickness, the wire pressure welding space needs to be reserved between the multiple wire-bonded wafers, the silicon substrate itself also has a certain thickness, and the overall thickness is large after the multiple wafers are stacked to some extent. Besides, the wire is usually a gold wire which is high in cost, the wire leads to a relatively long interconnection line, and the long interconnection line reduces the signal transmission speed and increases the power loss. In addition, the silicon substrate cannot meet the need of multi-wafer stacking high-density development for more and more common pads.

SUMMARY OF THE INVENTION

An objective of the present invention is to provide a multi-wafer stack structure to reduce the overall thickness of multi-wafer stacking.

Another objective of the present invention is to increase the signal transmission speed and reduce the power loss without using wires.

To solve the above technical problems, the present invention provides a multi-wafer stack structure, including:

a first wafer, wherein the first wafer includes a first substrate, a first dielectric layer and a first metal layer;

a second wafer, wherein the second wafer includes a second substrate, a second dielectric layer and a second metal layer, the first dielectric layer and the second dielectric layer being bonded to each other;

a first opening, wherein the first opening includes a first lower opening and a first upper opening; the first lower opening penetrating through the first substrate, the first dielectric layer and a portion of the second dielectric layer, and the first lower opening located above the second metal layer and exposing a portion of the second metal layer; the first upper opening penetrating through the first substrate and a portion of the first dielectric layer, and the first upper opening exposing a portion of the first metal layer; and the first lower opening communicating with the first upper opening;

a first interconnection layer, wherein the first interconnection layer is electrically connected to the second metal layer and the first metal layer via the first opening;

an insulating layer, wherein the insulating layer is located on a surface of the first substrate and the first interconnection layer;

second openings, wherein the second openings penetrate through the insulating layer, the second openings located above the first interconnection layer and exposing a portion of the first interconnection layer;

a third wafer, wherein the third wafer includes a third substrate, a third dielectric layer and a third metal layer;

third openings, wherein the third openings penetrate through a portion of the third dielectric layer and exposes a portion of the third metal layer, each of the third openings being aligned with a corresponding one of the second openings;

a second interconnection layer, wherein the second interconnection layer is electrically connected to the first interconnection layer via the second openings; and a third interconnection layer, wherein the third interconnection layer is electrically connected to the third metal layer via the third openings, the second interconnection layer being in contact with the third interconnection layer.

The present invention further provides a forming method of a multi-wafer stack structure, including:

providing a first wafer and a second wafer, wherein the first wafer includes a first substrate, a first dielectric layer and a first metal layer, the second wafer includes a second substrate, a second dielectric layer and a second metal layer, the first dielectric layer and the second dielectric layer being bonded to each other;

forming a first opening, wherein the first opening includes a first lower opening and a first upper opening; the first lower opening penetrates through the first substrate, the first dielectric layer and a portion of the second dielectric layer, and the first lower opening is located above the second metal layer and exposes a portion of the second metal layer; the first upper opening penetrates through the first substrate and a portion of the first dielectric layer, and the first upper opening exposes a portion of the first metal layer; the first lower opening communicates with the first upper opening;

forming a first interconnection layer, wherein the first interconnection layer is electrically connected to the second metal layer and the first metal layer via the first opening;

forming an insulating layer, wherein the insulating layer is located on a surface of the first substrate and the first interconnection layer; and forming second openings in the insulating layer, wherein the second openings expose a portion of the first interconnection layer;

providing a third wafer, wherein the third wafer includes a third substrate, a third dielectric layer and a third metal layer;

forming third openings, wherein the third openings penetrate through a portion of the third dielectric layer and expose a portion of the third metal layer, and each of the third openings is aligned with a corresponding one of the second openings;

forming a second interconnection layer and a third interconnection layer, wherein the second interconnection layer is electrically connected to the first interconnection layer via the second openings, and the third interconnection layer is electrically connected to the third metal layer via the third openings; and bonding the first wafer and the third wafer to bring the second interconnection layer into contact with the third interconnection layer, thereby interconnecting the first wafer, the second wafer and the third wafer.

In the multi-wafer stack structure and method provided by the present invention, the first interconnection layer is electrically connected to the second metal layer and the first metal layer via the first opening, the second interconnection layer is electrically connected to the first interconnection layer via the second opening, the third interconnection layer is electrically connected to the third metal layer via the third opening, and the second interconnection layer is in contact with the third interconnection layer, so that there is no need to reserve the wire pressure welding space between the wafers and the silicon substrate is eliminated, thereby achieving multi-wafer interconnection and reducing the thickness of the multi-wafer stacking. Therefore, the overall device thickness of the multi-wafer stack package is reduced, the package density is increased, and the requirements for semiconductor products to become thinner and thinner are met. Moreover, the multi-wafer stack structure no longer needs a wire, and the design processing of the silicon substrate and the plurality of common pads on the silicon substrate is eliminated, which is advantageous in reducing the cost and simplifying the process. In addition, the second interconnection layer is in contact with the third interconnection layer to shorten the interconnection distance between wafers, thereby reducing the parasitic capacitance and power loss, and increasing the transmission speed.

The reference signs are as follows:

10—first wafer; 101—first substrate; 102—first dielectric layer; 103—first metal layer; 104—first etching stopping layer; 102a—first dielectric layer first portion; 102b—first dielectric layer second portion; 105—insulating layer; 106—first passivation layer;

20—second wafer; 201—second substrate; 202—second dielectric layer; 203—second metal layer; 204—second etching stopping layer 204; 202a—second dielectric layer first portion; 202b—second dielectric layer second portion; 205—second passivation layer;

31—first bonding interface; 32—second bonding interface; 33—third bonding interface; 34—fourth bonding interface;

61—first opening; 61a—first lower opening; 61b—first upper opening; 62—second opening; 63—third opening;

70—filling layer;

81—first interconnection layer; 82—second interconnection layer; 83—third interconnection layer;

30—third wafer; 301—third substrate; 302—third dielectric layer; 303—third metal layer; 304—third etching stopping layer; 302a—third dielectric layer first portion; 302b—third dielectric layer second portion; 305—passivation layer;

40—fourth wafer; 401—fourth substrate;

50—fifth wafer; 501—fifth substrate.

DETAILED DESCRIPTION OF EXEMPLARY EMBODIMENTS

Hereinafter, a multi-wafer stack structure and method according to the present invention will be further described in detail with reference to the accompanying drawings and specific embodiments. Advantages and features of the present invention will become more apparent from the following description. It should be noted that the drawings are in a very simplified form and are used in a non-precise scale, and are merely for convenience and clarity of the purpose of the embodiments of the present invention.

Figure 1:
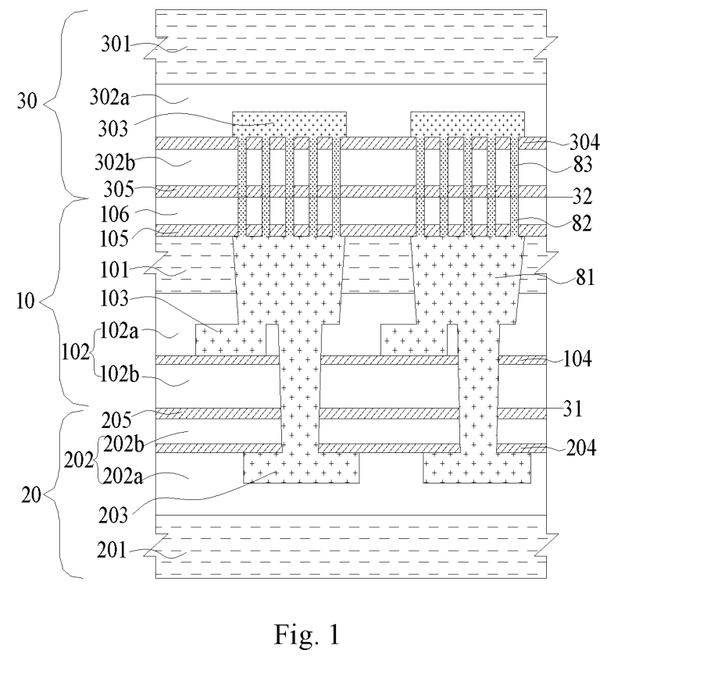
FIG. 1 is a schematic cross-sectional view of a multi-wafer stack structure according to an embodiment of the present invention.
Figure 6:
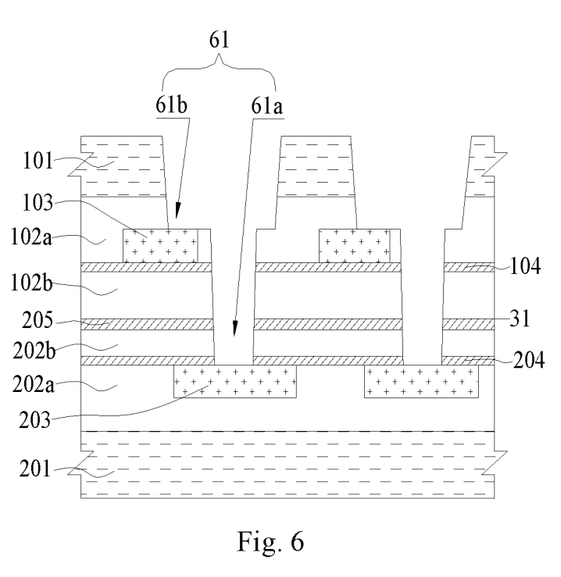
FIG. 6 is a schematic cross-sectional view after a first upper opening is formed according an embodiment of the present invention.
Figure 9:
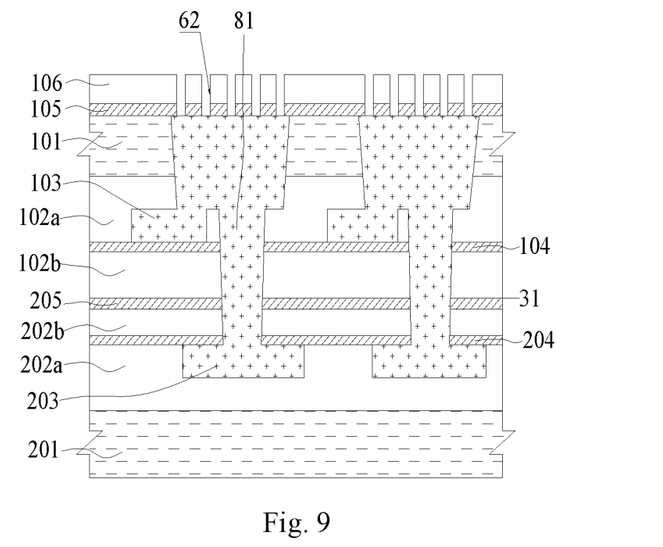
FIG. 9 is a schematic cross-sectional view after the second openings are formed according an embodiment of the present invention.
Figure 10:
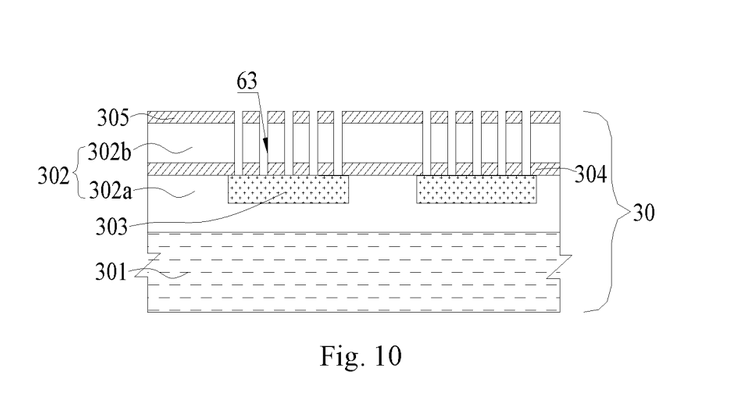
FIG. 10 is a schematic cross-sectional view of a third wafer after the third openings are formed according to an embodiment of the present invention.

The multi-wafer stack structure provided by the embodiment of the present invention is described in detail below with reference to FIG. 1, FIG. 6, FIG. 9 and FIG. 10. A multi-wafer stack structure includes:

a first wafer 10, where the first wafer 10 includes a first substrate 101, a first dielectric layer 102 located on the first substrate 101 and a first metal layer 103 embedded in the first dielectric layer 102;

a second wafer 20, where the second wafer 20 includes a second substrate 201, a second dielectric layer 202 located on the second substrate 201 and a second metal layer 203 embedded in the second dielectric layer 202, and the first dielectric layer 102 and the second dielectric layer 202 are bonded to each other;

a first opening 61, where the first opening 61 includes a first lower opening 61a and a first upper opening 61b; the first lower opening 61a penetrates through the first substrate 101, the first dielectric layer 102 and a portion of the second dielectric layer 202, and the first lower opening 61a is located above the second metal layer 203 and exposes a portion surface of the second metal layer 203; the first upper opening 61b penetrates through the first substrate 101 and a portion of the first dielectric layer 102, and the first upper opening 61b exposes a portion surface of the first metal layer 103; and the first lower opening 61a communicates with the first upper opening 61b;

a first interconnection layer 81, where the first interconnection layer 81 is electrically connected to the second metal layer 203 and the first metal layer 103 via the first opening 61;

an insulating layer 105, where the insulating layer is located on a surface of the first substrate 101 and the first interconnection layer 81;

second openings 62, where the second openings 62 penetrate through the insulating layer 105, and the second openings 62 are located above the first interconnection layer 81 and expose a portion of the first interconnection layer 81;

a third wafer 30, where the third wafer 30 includes a third substrate 301, a third dielectric layer 302 and a third metal layer 303;

third openings 63, where the third openings 63 penetrate through a portion of the third dielectric layer 302 and expose a portion of the third metal layer 303, and the third openings 63 are disposed corresponding to the second openings 62;

a second interconnection layer 82, where the second interconnection layer 82 is electrically connected to the first interconnection layer 81 via the second openings 62; and a third interconnection layer 83, where the third interconnection layer 83 is electrically connected to the third metal layer 304 via the third openings 63, and the second interconnection layer 82 is in contact with the third interconnection layer 83.

In order to reduce the overall thickness after the multi-wafer stack interconnection, after the first dielectric layer 102 and the second dielectric layer 202 are bonded to each other, the first wafer 10 and/or the second wafer 20 are thinned; after the first wafer 10 and the third wafer 30 are bonded, the third wafer 30 is thinned.

Preferably, as shown in FIG. 9 and FIG. 10, the second openings 62 and the third openings 63 each respectively include a plurality of spaced apart pores, that is, each of the second openings 62 and each of the third openings 63 are respectively a pore array composed of a plurality of pores. In the plurality of spaced apart pores, the second interconnection layer 82 is in contact with the third interconnection layer 83, thereby increasing the interconnection reliability and reducing heat generated in the operation of the interconnection layer by spacing. Moreover, the plurality of spaced apart pores can be made smaller in size and larger in density, thereby also meeting product interconnection requirements for certain specific applications. For example, the signal that needs to be evoked by interconnection is a signal with high density and low current, and correspondingly, the pores and interconnection layers in the pores need to be smaller in size and larger in density.

Preferably, as shown in FIG. 1, the first dielectric layer 102 includes a first dielectric layer first portion 102a and a first dielectric layer second portion 102b, and the first metal layer 103 is embedded between the first dielectric layer first portion 102a and the first dielectric layer second portion 102b. The second dielectric layer 202 includes a second dielectric layer first portion 202a and a second dielectric layer second portion 202b, and the second metal layer 203 is embedded between the second dielectric layer first portion 202a and the second dielectric layer second portion 202b.

Preferably, the first wafer 10 further includes a first etching stopping layer 104, and the first etching stopping layer 104 is located between the first metal layer 103 and the first dielectric layer second portion 102b. The second wafer 20 further includes a second etching stopping layer 204, and the second etching stopping layer 204 is located between the second metal layer 203 and the second dielectric layer second portion 202b.

Preferably, the surface of the insulating layer 105 is formed with a first passivation layer 106, and the first passivation layer 106 is, for example an oxide layer that functions to protect the surface of the first wafer 10.

Figure 2:
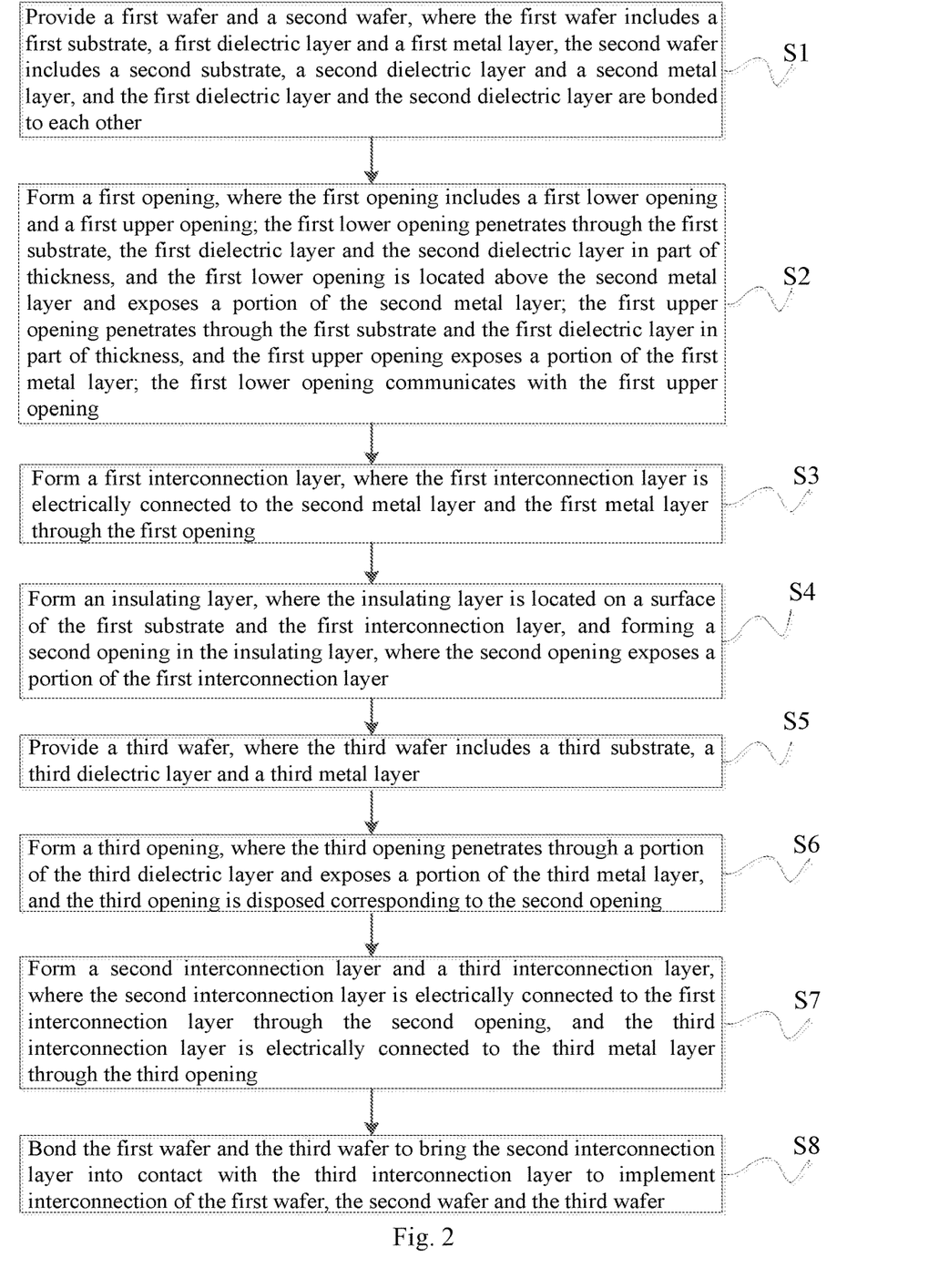
FIG. 2 is a flow chart of a forming method of a multi-wafer stack structure according to an embodiment of the present invention.

The forming method of a multi-wafer stack structure provided by the embodiment of the present invention, as shown in FIG. 2, includes:

providing a first wafer 10 and a second wafer 20, where the first wafer 10 includes a first substrate 101, a first dielectric layer 102 located on the first substrate 101 and a first metal layer 103 embedded in the first dielectric layer 102; the second wafer 20 includes a second substrate 201, a second dielectric layer 202 located on the second substrate 201 and a second metal layer 203 embedded in the second dielectric layer 202, and the first dielectric layer 102 and the second dielectric layer 202 are bonded to each other;

forming a first opening 61, where the first opening 61 includes a first lower opening 61a and a first upper opening 61b; the first lower opening 61a penetrates through the first substrate 101, the first dielectric layer 102 and a portion of the second dielectric layer 202, and the first lower opening 61a is located above the second metal layer 203 and exposes a portion surface of the second metal layer 203; the first upper opening 61b penetrates through the first substrate 101 and a portion of the first dielectric layer 102, and the first upper opening 61b exposes a portion surface of the first metal layer 103; and the first lower opening 61a communicates with the first upper opening 61b;

forming a first interconnection layer 81, where the first interconnection layer 81 is electrically connected to the second metal layer 203 and the first metal layer 103 via the first opening 61;

forming an insulating layer 105, where the insulating layer is located on a surface of the first substrate 101 and the first interconnection layer 81; forming second openings 62 in the insulating layer 105, where the second openings 62 are located above the first interconnection layer 81 and expose a portion of the first interconnection layer 81;

providing a third wafer 30, where the third wafer 30 includes a third substrate 301, a third dielectric layer 302 and a third metal layer 303;

forming third openings 63, where the third openings 63 penetrate through a portion of the third dielectric layer 302 and expose a portion surface of the third metal layer 303, and the third openings 63 are disposed corresponding to the second openings 62;

forming a second interconnection layer 82 and a third interconnection layer 83, where the second interconnection layer 82 is electrically connected to the first interconnection layer 81 via the second openings 62, and the third interconnection layer 83 is electrically connected to the third metal layer 304 via the third openings 63; and bonding the first wafer 10 and the third wafer 30 to bring the second interconnection layer 82 into contact with the third interconnection layer 83 to implement interconnection of the first wafer 10, the second wafer 20 and the third wafer 30.

The present invention does not limit which wafer of the first wafer and the second wafer must be placed above/below, but the positions of the upper and lower wafers can be interchanged. Herein, for the sake of simplicity and convenience of description, only one positional relationship of the two wafers is shown. Those skilled in the art can understand that all the technical contents described herein are also applicable to the case where the positions of the "first wafer" and the "second wafer" are reversed up and down. At this time, the positional relationship of the layers of the stacked semiconductor device is also reversed up and down accordingly. In some cases, preferably, during a bonding process on two wafers, a wafer having a relatively large wafer bow is placed below. However, in this case, after the wafer bonding is completed, it is also possible to determine whether to reverse up and down according to actual needs, thereby ultimately determining which wafer is above and which wafer is below.

It is to be noted that the terms "first", "second", "third", "fourth" and the like are used herein to distinguish different components or techniques having the same name, and do not mean a sequence or a positional relationship or the like. In addition, for different components having the same name, such as "first substrate" and "second substrate", "first dielectric layer" and "second dielectric layer", etc., it does not mean that they have the same structure or components. For example, although not shown in the drawings, in most cases, the components formed in the "first substrate" and the "second substrate" are different, and the structures of the substrates may be different. In some implementations, the substrate may be a semiconductor substrate made of any semiconductor material (e.g., Si, SiC, SiGe, etc.) suitable for a semiconductor device. In other implementations, the substrate may also be a composite substrate such as silicon-on-insulator (SOI), silicon germanium-on-insulator, or the like. Those skilled in the art will understand that the substrate is not subject to any restrictions, but may be selected according to practical applications. Various devices (not limited to semiconductor devices) members (not shown in the figures) may be formed in the substrate. The substrate may also have been formed with other layers or members, such as gate structures, contact holes, dielectric layers, metal wires, through holes, and the like.

The manufacturing method provided by the embodiment of the present invention is described in detail below with reference to FIG. 3 to FIG. 13.

Figure 3:
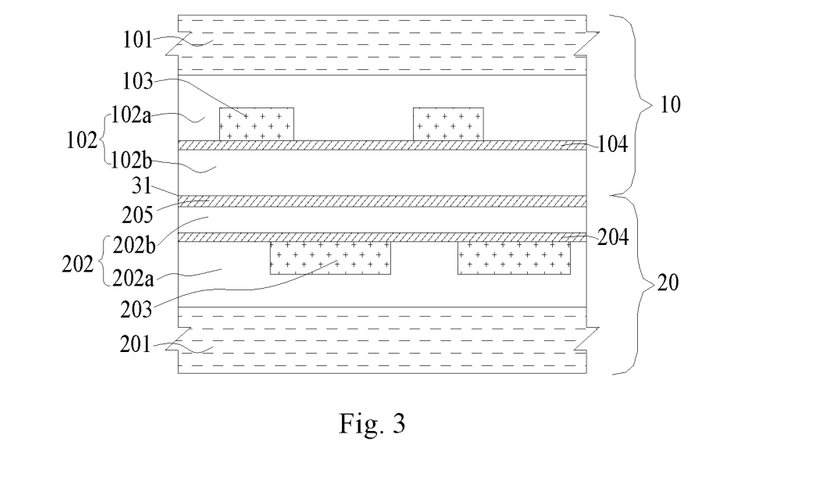
FIG. 3 is a schematic view of two wafers bonded according to an embodiment of the present invention.

First, as shown in FIG. 3, the first wafer 10 and the second wafer 20 bonded are provided. The first wafer 10 includes a first substrate 101, a first dielectric layer 102 formed on the first substrate 101 and a first metal layer 103 embedded in the first dielectric layer 102. The second wafer 20 includes a second substrate 201, a second dielectric layer 202 formed on the second substrate 201 and a second metal layer 203 embedded in the second dielectric layer 202. The first dielectric layer 102 faces the second dielectric layer 202, and the two wafers can be bonded by the intermolecular chemical force of the bonding interface film to form a first bonding interface 31.

Further, the first dielectric layer 102 includes a first dielectric layer first portion 102a and a first dielectric layer second portion 102b, and the first metal layer 103 is embedded between the first dielectric layer first portion 102a and the first dielectric layer second portion 102b. The second dielectric layer 202 includes a second dielectric layer first portion 202a and a second dielectric layer second portion 202b, and the second metal layer 203 is embedded between the second dielectric layer first portion 202a and the second dielectric layer second portion 202b.

In a preferred embodiment, the first wafer 10 further includes a first etching stopping layer 104, and the first etching stopping layer 104 is located between the first metal layer 103 and the first dielectric layer second portion 102b. The second wafer 20 further includes a second etching stopping layer 204, and the second etching stopping layer 204 is located between the second metal layer 203 and the second dielectric layer second portion 202b.

The second wafer 20 further includes a second passivation layer 205 located on the surface of the second dielectric layer second portion 202b. The second passivation layer is, for example, a nitride layer that functions to protect the surface of the second wafer 20. In this embodiment, the second passivation layer 205 is in contact with the second dielectric layer second portion 102b to form the first bonding interface 31.

Figure 4:
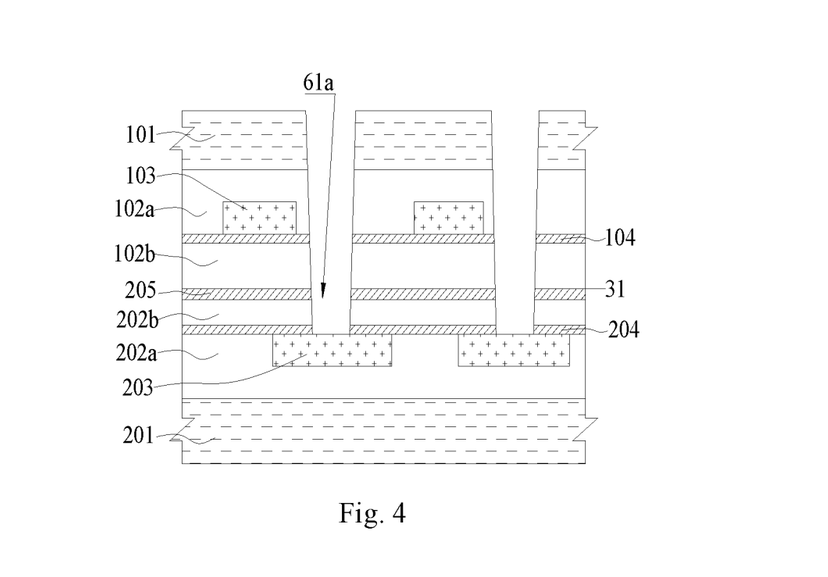
FIG. 4 is a schematic cross-sectional view after a first lower opening is formed according an embodiment of the present invention.

Next, as shown in FIG. 4, a plurality of first lower openings 61a are formed by etching, where the first lower opening 61a penetrates through the first substrate 101, the first dielectric layer 102 and a portion of the second dielectric layer 202, and the first lower opening 61a is located above the second metal layer 203 and exposes a portion surface of the second metal layer 203.

Figure 5:
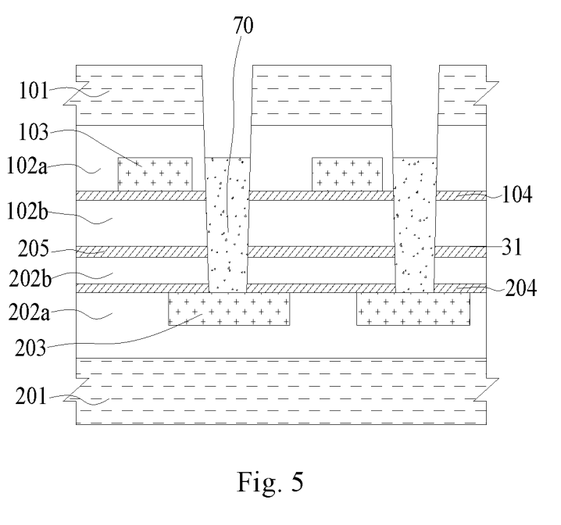
FIG. 5 is a schematic cross-sectional view after a filling layer is formed according to an embodiment of the present invention.

Next, as shown in FIG. 5, a filling layer 70 is formed, where the first lower opening 61a is filled with the filling layer 70 to protect the exposed portion of the second metal layer 203 in a subsequent etching process.

An etch back process is performed to thin the filling layer 70 until the upper top surface is flush with the upper top surface of the first metal layer 103.

The filling layer 70 is preferably a fluid organic solvent BARC 70 (Bottom Anti Reflective Coating).

Next, as shown in FIG. 6, a plurality of first upper openings 61b are formed by etching, where the first upper opening 61b penetrates through the first substrate 101 and a portion of the first dielectric layer 102, and the first upper opening 61b exposes a portion surface of the first metal layer 103. The cross section width of the first upper opening 61b is greater than the cross section width of the first lower opening 61a (the cross section referred to herein refers to a section that is cut perpendicular to the first wafer and the second wafer). The first upper opening 61b exposes a portion surface of the first metal layer 103, and the first lower opening 61a communicates with the first upper opening 61b, thereby constituting the first opening 61. Then etch back removes the filling layer 70 in the first lower opening 61a. In this embodiment, the first upper opening 61b and the first lower opening 61a are inverted trapezoidal openings.

Figure 7:
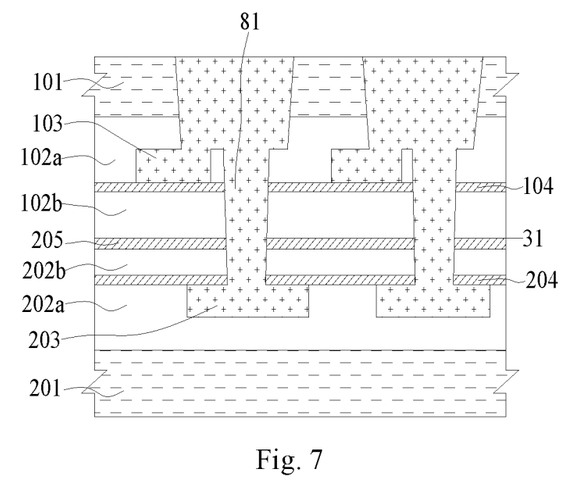
FIG. 7 is a schematic cross-sectional view after a first interconnection layer is formed according to an embodiment of the present invention.

Next, as shown in FIG. 7, a first interconnection layer 81 is formed, where the first interconnection layer 81 is electrically connected to the second metal layer 203 and the first metal layer 103 via the first lower opening 61a and the first upper opening 61b. The first interconnection layer 81 is made of a conductive material, which may be copper or a copper alloy. The first lower opening 61a and the first upper opening 61b may be filled by copper electroplating to cover the surface of the first substrate 101, and chemical mechanical polishing planarization is performed.

Figure 8:
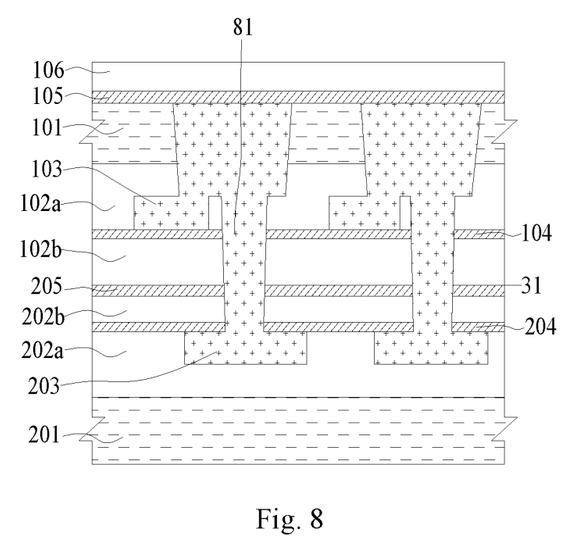
FIG. 8 is a schematic cross-sectional view after an insulating layer is formed according to an embodiment of the present invention.

Next, as shown in FIGS. 8 and 9, an insulating layer 105 is formed on the surface of the first substrate 101 and the first interconnection layer 81.

Preferably, the surface of the insulating layer 105 is formed with a first passivation layer 106, and the first passivation layer 106 is, for example an oxide layer that functions to protect the surface of the first wafer 10.

The second openings 62 are formed in the insulating layer 105 by etching, where the second openings 62 penetrate through the insulating layer 105 and the first passivation layer 106 and expose a portion of the first interconnection layer 81.

Next, as shown in FIG. 10, a third wafer 30 is provided, where the third wafer 30 includes a third substrate 301, a third dielectric layer 302 located on the third substrate 301 and a third metal layer 303 embedded in the third dielectric layer 302. Further, the third dielectric layer 302 includes a third dielectric layer first portion 302a and a third dielectric layer second portion 302b, and the third metal layer 303 is embedded between the third dielectric layer first portion 302a and the third dielectric layer second portion 302b. In a preferred embodiment, the third wafer 30 further includes a third etching stopping layer 304, and the third etching stopping layer 304 is located between the third metal layer 303 and the third dielectric layer second portion 302b. The surface of the third dielectric layer 302 is formed with a third passivation layer 305, and the third passivation layer 305 is, for example an oxide layer that functions to protect the surface of the third wafer 30.

Next, referring to FIG. 9 and FIG. 10, an etching process is performed to form a plurality of third openings 63, where the third openings 63 penetrate through the passivation layer 305, the third dielectric layer second portion 302b and the third etching stopping layer 304 and exposes a portion of the third metal layer 303, and the third openings 63 corresponds to the second openings 62.

Figure 11:
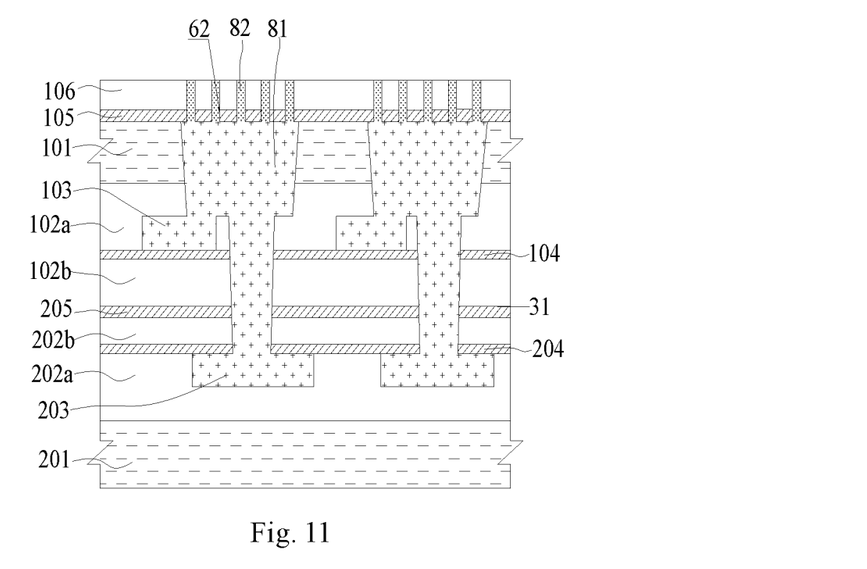
FIG. 11 is a schematic cross-sectional view after a second interconnection layer is formed in the second openings according an embodiment of the present invention.

Next, as shown in FIG. 11, a second interconnection layer 82 is formed, where the second interconnection layer 82 is electrically connected to the first interconnection layer 81 via the second openings 62.

Figure 12:
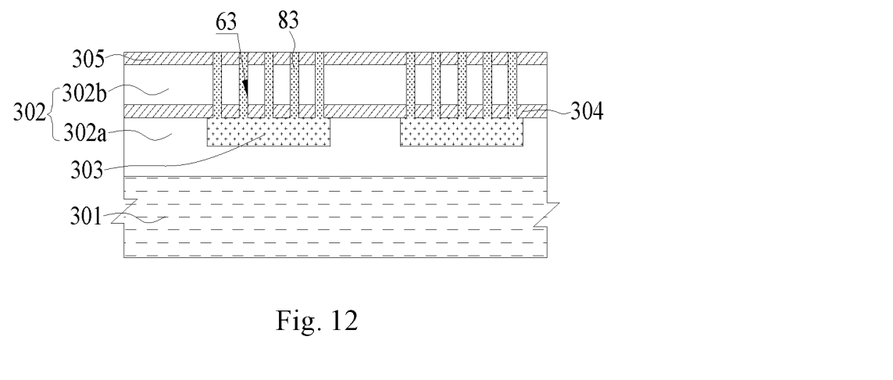
FIG. 12 is a schematic cross-sectional view after a third interconnection layer is formed in the third openings of the third wafer according to an embodiment of the present invention.

Next, as shown in FIG. 12, a third interconnection layer 83 is formed, where the third interconnection layer 83 is electrically connected to the third metal layer 303 via the third openings 63.

Preferably, the second openings 62 and third openings 63 formed respectively include a plurality of spaced apart pores. In the plurality of spaced apart pores, the second interconnection layer 82 is in contact with the third interconnection layer 83, thereby increasing the interconnection reliability and reducing heat generated in the operation of the interconnection layer by spacing.

It can be understood that the second interconnection layer 82 may be formed before the third interconnection layer 83 is formed, or the third interconnection layer 83 may be formed before the second interconnection layer 82 is formed, or the steps of forming the second interconnection layer 82 and forming the third interconnection layer 83 may be performed simultaneously.

The second interconnection layer 82 and the third interconnection layer 83 are made of a conductive material, which may be copper or a copper alloy. The second openings 62 and the third openings 63 may be filled by copper electroplating, and chemical mechanical polishing planarization is performed.

Next, as shown in FIG. 1, FIG. 11 and FIG. 12, the first wafer 10 and the third wafer 30 are aligned to bring the second interconnection layer 82 into contact with the third interconnection layer 83 to shorten the interconnection distance between wafers, thereby reducing the parasitic capacitance and power loss, and increasing the transmission speed. The metal-to-metal and dielectric layer-to-dielectric layer hybrid bonding is utilized to form a second bonding interface 32, and then the metal ions are diffused by a subsequent heat treatment process to enhance the bonding force, thereby realizing the three-wafer interconnection.

Figure 13:
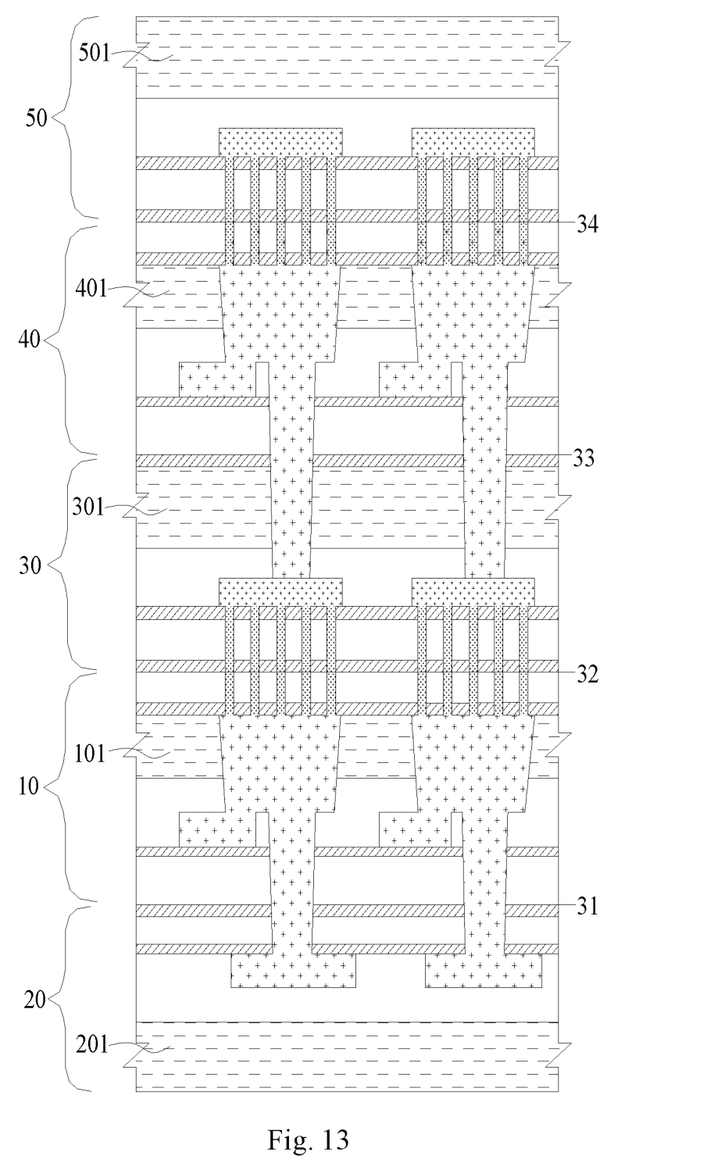
FIG. 13 is a schematic view of multiple wafers bonded according to an embodiment of the present invention.

Next, as shown in FIG. 13, a fourth wafer 40 is continuously bonded on the third wafer 30 to form a bonding interface 33, multi-wafer stack interconnection is formed by the same method as the three-wafer stack interconnection, a fourth opening for interconnection between the fourth wafer 40 and a fifth wafer 50 is formed by the same method as forming the first opening 61, and the multi-wafer stack interconnection is subsequently formed in turn. In this embodiment, the interconnection of five layers of wafers is realized. The substrates of the five wafers in the illustrated example are a first substrate 101, a second substrate 201, a third substrate 301, a fourth substrate 401 and a fifth substrate 501, respectively. A first bonding interface 31, a second bonding interface 32, a third bonding interface 33 and a fourth bonding interface 34 are sequentially formed between the wafers. After the wafer bonding, the wafer is thinned according to the bonded wafer. The three-wafer stack structure can be repeated as many times as needed to achieve higher-density multi-wafer stacking and interconnection under the overall thickness requirements of the multi-wafer interconnection, so that the final device has more powerful functions.

In summary, in the multi-wafer stack structure and method provided by the present invention, there is no need to reserve the wire pressure welding space between the wafers and the silicon substrate is eliminated, thereby achieving multi-wafer interconnection and reducing the thickness of the multi-wafer stacking. Therefore, the overall device thickness of the multi-wafer stack package is reduced, the package density is increased, more wafers can be accommodated per unit volume, and the requirements for semiconductor products to become thinner and thinner are met. Moreover, a wire is no longer needed, and the design processing of the silicon substrate and the plurality of common pads on the silicon substrate is eliminated, thereby reducing the cost and simplifying the process. Thereby, the wafer integration capability is enhanced, and different functional wafers (such as RF, Memory, Logic, Sensors, and Imagers) are integrated into a single package, thereby providing significant advantages in performance, functionality and size.

The above description is only for the description of the preferred embodiments of the present invention, and is not intended to limit the scope of the present invention. Any changes and modifications made by those skilled in the art in light of the above disclosure are all within the scope of the appended claims.

What is claimed is:

1. A multi-wafer stack structure, comprising:
    a first wafer, wherein the first wafer comprises a first substrate, a first dielectric layer and a first metal layer;
    a second wafer, wherein the second wafer comprises a second substrate, a second dielectric layer and a second metal layer, the first dielectric layer and the second dielectric layer being bonded to each other;
    a first opening, wherein the first opening comprises a first lower opening and a first upper opening; the first lower opening penetrating through the first substrate, the first dielectric layer and a portion of the second dielectric layer, and the first lower opening located above the second metal layer and exposing a portion of the second metal layer; the first upper opening penetrating through the first substrate and a portion of the first dielectric layer, and the first upper opening exposing a portion of the first metal layer; and the first lower opening communicating with the first upper opening;
    a first interconnection layer, wherein the first interconnection layer is electrically connected to the second metal layer and the first metal layer via the first opening;
    an insulating layer, wherein the insulating layer is located on a surface of the first substrate and the first interconnection layer;

second openings, wherein the second openings penetrate through the insulating layer, the second openings located above the first interconnection layer and exposing a portion of the first interconnection layer, the second openings comprising a plurality of spaced apart pores;

a third wafer, wherein the third wafer comprises a third substrate, a third dielectric layer and a third metal layer;

third openings, wherein the third openings penetrate through a portion of the third dielectric layer and exposes a portion of the third metal layer, the third openings comprises a plurality of spaced apart pores, and the plurality of spaced apart pores of the third openings are aligned with the plurality of spaced apart pores of the second opening;

a second interconnection layer, wherein the second interconnection layer is filled in the plurality of spaced apart pores of the second openings and electrically connected to the first interconnection layer so as to pick up the first interconnection layer via the second interconnection layer; and a third interconnection layer, wherein the third interconnection layer is filled in the plurality of spaced apart pores of the third openings and electrically connected to the third metal layer so as to pick up the third metal layer via the third interconnection layer; the second interconnection layer and the third interconnection layer are aligned and interconnected with each other, such that the first wafer and the third wafer are hybrid bonded to form a single flat interface.

2. The multi-wafer stack structure according to claim 1, wherein the first dielectric layer comprises a first dielectric layer first portion and a first dielectric layer second portion, and the first metal layer is embedded between the first dielectric layer first portion and the first dielectric layer second portion; the second dielectric layer comprises a second dielectric layer first portion and a second dielectric layer second portion, and the second metal layer is embedded between the second dielectric layer first portion and the second dielectric layer second portion.

3. The multi-wafer stack structure according to claim 2, wherein the first wafer further comprises a first etching stopping layer, and the first etching stopping layer is located between the first metal layer and the first dielectric layer second portion; the second wafer further comprises a second etching stopping layer, and the second etching stopping layer is located between the second metal layer and the second dielectric layer second portion.

4. The multi-wafer stack structure according to claim 1, further comprising a first passivation layer covering the insulating layer, wherein the first passivation layer is an oxide layer.

5. The multi-wafer stack structure according to claim 1, wherein further comprising a second passivation layer covering the second dielectric layer, wherein the second passivation layer is a nitride layer.

6. The multi-wafer stack structure according to claim 1, further comprising a third passivation layer covering the third dielectric layer, wherein the third passivation layer is an oxide layer.

7. The multi-wafer stack structure according to claim 1, wherein the first interconnection layer, the second interconnection layer, and the third interconnection layer are made of metal.

* * * * *